(12) United States Patent
Chiu et al.

(10) Patent No.: US 7,556,153 B2
(45) Date of Patent: Jul. 7, 2009

(54) WAFER POD AND WAFER HOLDING DEVICE THEREOF

(75) Inventors: Ming-Lung Chiu, Shulin (TW); Pao-Yi Lu, Shulin (TW)

(73) Assignee: Gudeng Precision Industrial Co., Ltd., Taipei County (TW)

( * ) Notice: Subject to any disclaimer, the term of this patent is extended or adjusted under 35 U.S.C. 154(b) by 533 days.

(21) Appl. No.: 11/541,547

(22) Filed: Oct. 3, 2006

(65) Prior Publication Data

US 2008/0041759 A1    Feb. 21, 2008

(30) Foreign Application Priority Data

Aug. 15, 2006    (TW) .............................. 95214403 U

(51) Int. Cl.
*B65D 85/00*    (2006.01)

(52) U.S. Cl. ........................ 206/710; 206/445; 206/454

(58) Field of Classification Search ................. 206/710, 206/711, 449, 454, 445; 414/416.08, 936, 414/217.1; 211/41.18
See application file for complete search history.

(56) References Cited

U.S. PATENT DOCUMENTS

| 5,452,795 | A | * | 9/1995 | Gallagher et al. | ............ 206/711 |
| 5,853,214 | A | * | 12/1998 | Babbs et al. | ................. 294/161 |
| 5,960,959 | A | * | 10/1999 | Wu et al. | ..................... 206/710 |
| 6,254,682 | B1 | * | 7/2001 | Mendiola et al. | ............ 118/500 |
| 6,622,883 | B1 | * | 9/2003 | Wu et al. | ..................... 220/323 |
| 7,246,708 | B2 | * | 7/2007 | Chuang et al. | ........... 211/41.18 |
| 2003/0010672 | A1 | * | 1/2003 | Simpson et al. | ............. 206/711 |
| 2003/0010673 | A1 | * | 1/2003 | Duban-Hu et al. | .......... 206/711 |
| 2003/0121870 | A1 | * | 7/2003 | Beckhart et al. | ......... 211/41.18 |
| 2004/0134828 | A1 | * | 7/2004 | Conarro | ..................... 206/710 |

* cited by examiner

*Primary Examiner*—Jacob K Ackun, Jr.
*Assistant Examiner*—Robert Poon
(74) *Attorney, Agent, or Firm*—Ming Chow; Sinorica, LLC

(57) ABSTRACT

A wafer holding device for a wafer pod is disclosed. The disclosed wafer holding device includes a support frame mounted on one side of the housing of the wafer pod, an actuating frame, two rotating arms and two wafer retainers. When the housing and the base of a wafer pod are assembled, the actuating frame moves and forces the wafer retainers to rotate in a direction perpendicular to the edge surface of the wafers.

20 Claims, 6 Drawing Sheets

WAFER POD AND WAFER HOLDING DEVICE THEREOF

BACKGROUND OF THE INVENTION

1. Field of the Invention

This invention relates to a wafer pod and, more particularly, to a wafer pod provided with wafer holding device for retaining securely the wafers inside the wafer pod.

2. Description of the Related Art

It is well known that a wafer pod is always applied to store and preserve the wafers used in a semiconductor processing system. The object is to prevent the wafers from being damaged by equipments or other machines or polluted by particulate release or dust during transportation. To achieve the object, the wafers must be held securely within the wafer cassette inside a wafer pod.

As shown in FIGS. 1A and 1B, a conventional wafer pod 10 is mainly composed of a hollow housing 11 and a base 22 upon which a wafer cassette 21 for storing a plurality of wafers is mounted. When the hollow housing 11 and the base 22 with the wafer cassette 21 are together equipped, the hollow housing 11 receives the wafer cassette 21 and the room there between is made airtight.

Again considering the wafer pod 10, one can note that a first retaining mechanism 12 and a second retaining mechanism 13 are also provided. They are provided here to retain securely the wafers 23 in the wafer cassette 21 such that the wafers 23 would not move due to any vibration or shake of the wafer pod 10 and therefore the damage and particulate release of the wafers 23 can be avoided.

Referring to FIG. 1B, the retaining mechanisms 12 and 13 are actually linkage mechanisms including four-bar and five-bar types. When the housing 11 and the base 22 are together equipped, the base 22 contacts and forces the retaining mechanisms 12 and 13 such that the link-bars neighboring the wafers 23 contact and securely retain the wafers 23 in the wafer cassette 21.

However, for this wafer pod 10, there are still problems in totally preventing the wafers from being damaged by equipments or polluted by particulate release. As we can see, the movement of the link-bars neighboring the wafers 23 is not in a direction parallel to the plane surface of the wafers 23 or perpendicular to the edge surface of the wafers 23. This can cause the wafers 23 to quiver and rub against the link-bars neighboring the wafers 23 and therefore results in damages to and undesired particulate release from the wafers 23.

In view of this, an improved wafer pod with wafer holding device is disclosed. The proposed wafer holding device is characterized in that the wafers are retained securely by applying forces parallel to the edge surface of the wafers stored in the cassette when the housing and the base are equipped together.

SUMMARY OF THE INVENTION

In this disclosure, an improved wafer holding device is proposed to solve the above mentioned problems of wafer damages and particulate release in the conventional wafer pod.

Therefore, it is an object of the present invention to provide a wafer holding device to securely retain the wafers without causing any damage to the wafers.

It is another object of the present invention to provide a wafer holding device to securely retain the wafers without generating undesired dust or particulate release.

These objects are realized in a wafer holding device having a support frame mounted on the housing of a wafer pod, an actuating frame, two rotating arms, and two wafer retainers. The rotating arms each has a first rod transversely connected to and pivoted on the support frame and a second rod transversely connected to and pivoted on the actuating frame. The two wafer retainers are longitudinally connected to and pivoted on two sides of the support frame respectively and in contact with the actuating frame. In this way, the movement of the actuating frame enables the wafer retainers to rotate in a direction perpendicular to the edge surface of the stored wafers.

In an embodiment, the actuating frame has two first rollers respectively provided at the bottom. When the housing and the base are assembled, the base contacts the first rollers and forces the actuating frame to move. Moreover, the actuating frame is further provided with four second rollers two of which are respectively near two ends of the second rod of the rotating arms. These second rollers contact with the wafer retainers and force the wafer retainers to rotate when the housing and the base are assembled.

On the other hand, the wafer retainers are respectively elastically pivoted on two side of the support frame. Thus, when the housing and the base of a wafer pod are released from assembling, the actuating frame of the wafer holding device returns to its original position due to gravity and the wafer retainers return to their original position from the position in contact with the wafers due to the recovery elasticity.

The first rollers, second rollers, and the wafer retainers are preferably made of high wear-resisting materials such as polyether ether ketone.

The wafer holding device of the present invention is advantaged by the followings. First, the retaining forces are provided in direction perpendicular to the edge surface or parallel to the plane surface of the stored wafers so that the retaining forces can be evenly distributed on the wafers without damaging wafers and causing undesired particulate release. Secondly, the elements in act such as the rollers of the wafer holding device and the wafer retainers are made of high wear-resisting materials to further avoid undesired particulate release.

DETAILED DESCRIPTION OF THE EMBODIMENTS

Reference will now be made to the drawings in which various elements of the present invention will be given numerical designations and in which the invention will be discussed so as to enable one skilled in the art to make and use the invention.

Figure 1A:
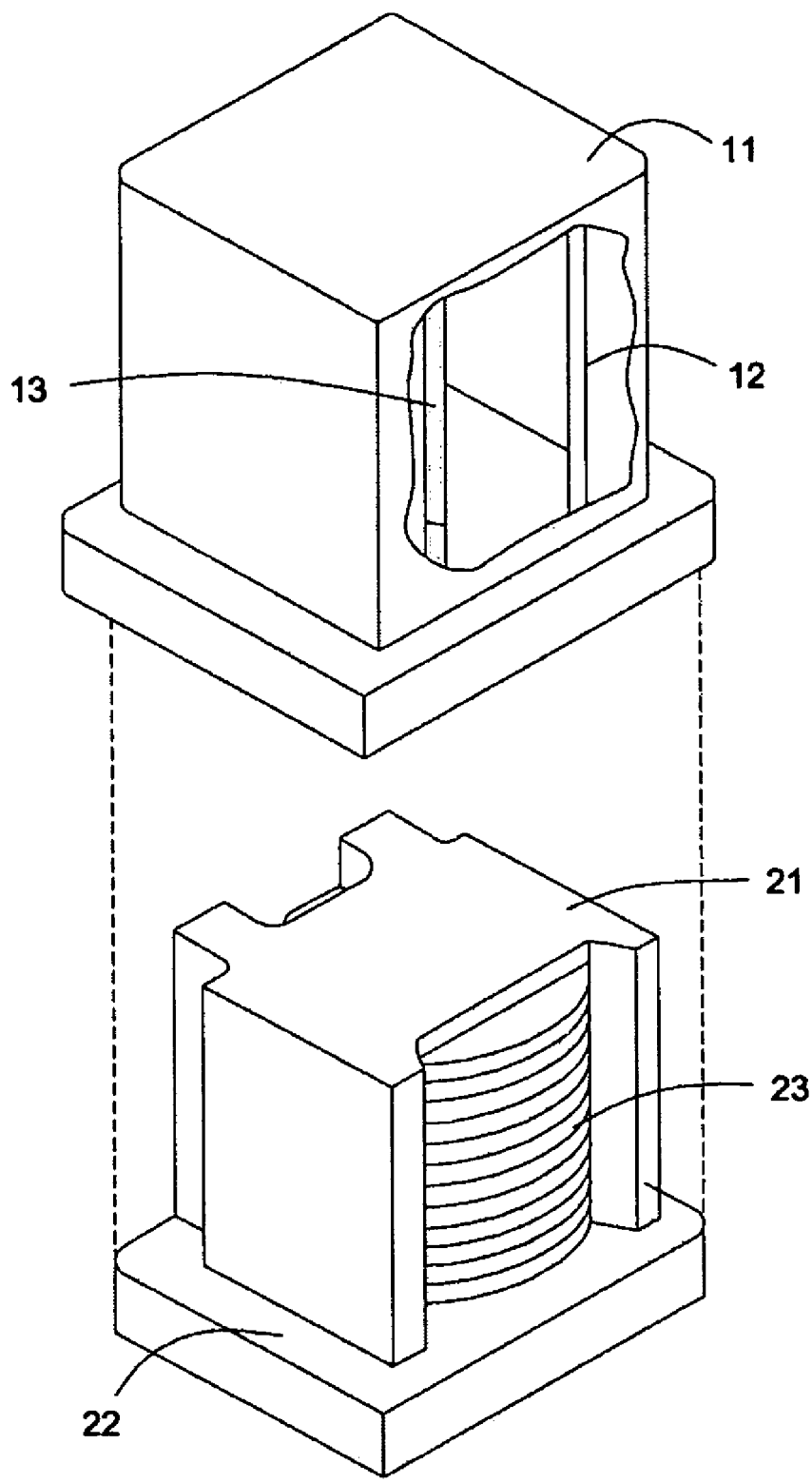
FIG. 1A is a schematic diagram showing the separating state of the housing and the base of a conventional wafer pod.
Figure 1B:
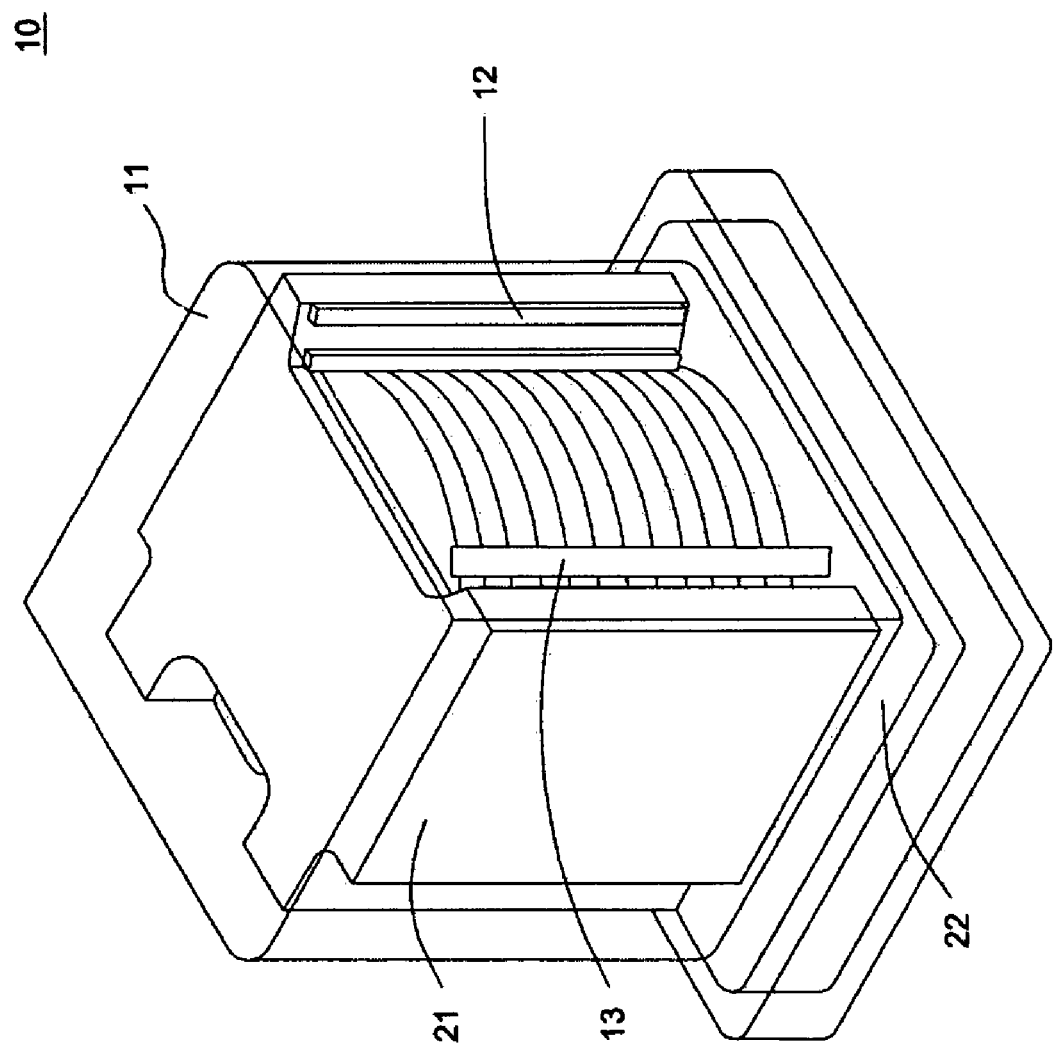
FIG. 1B is a schematic diagram showing the assembling state of the housing and the base of the conventional wafer pod.
Figure 2A:
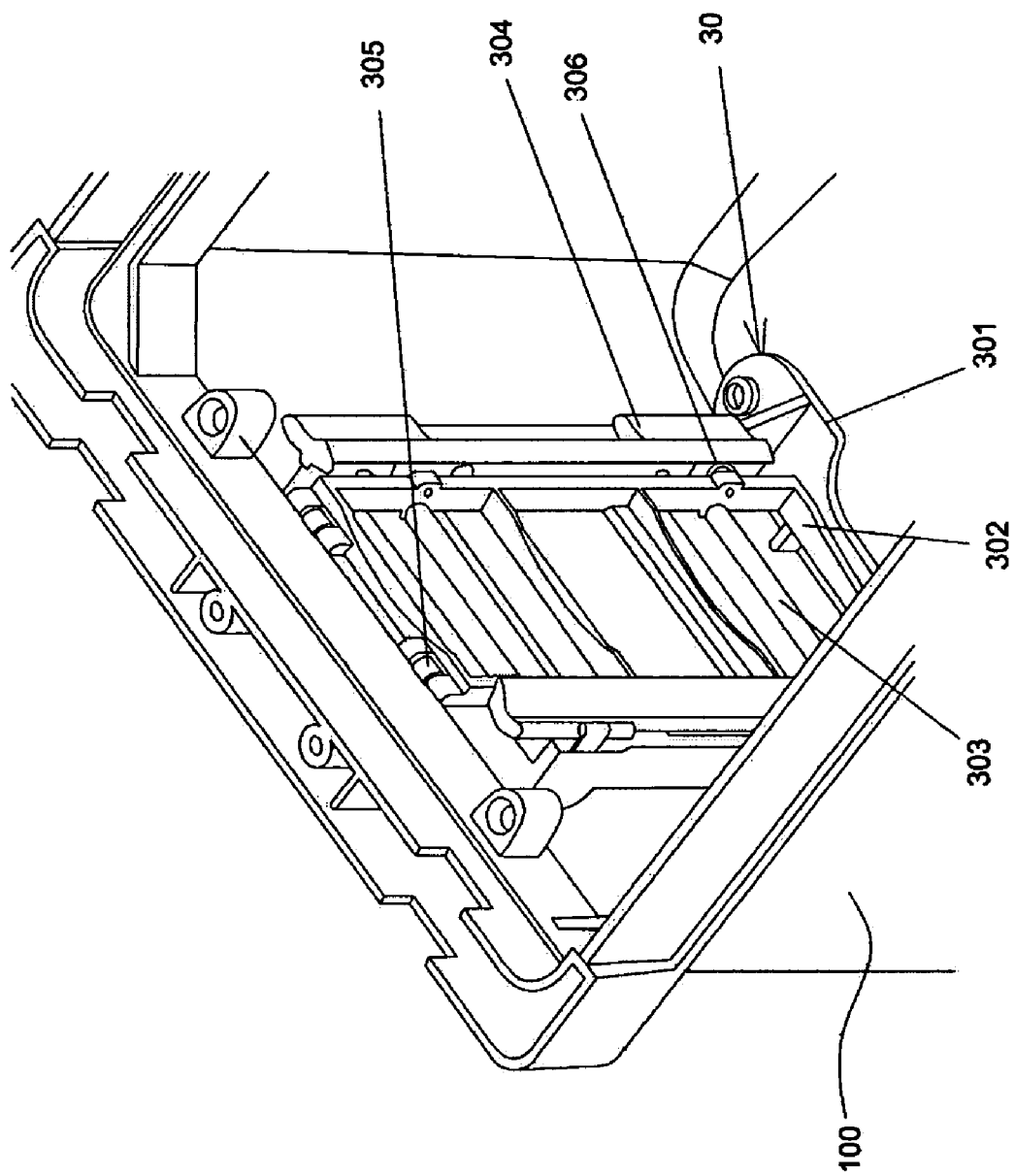
FIG. 2A is a perspective diagram showing the relationship between the housing and the wafer holding device according to one embodiment of the invention.
Figure 2B:
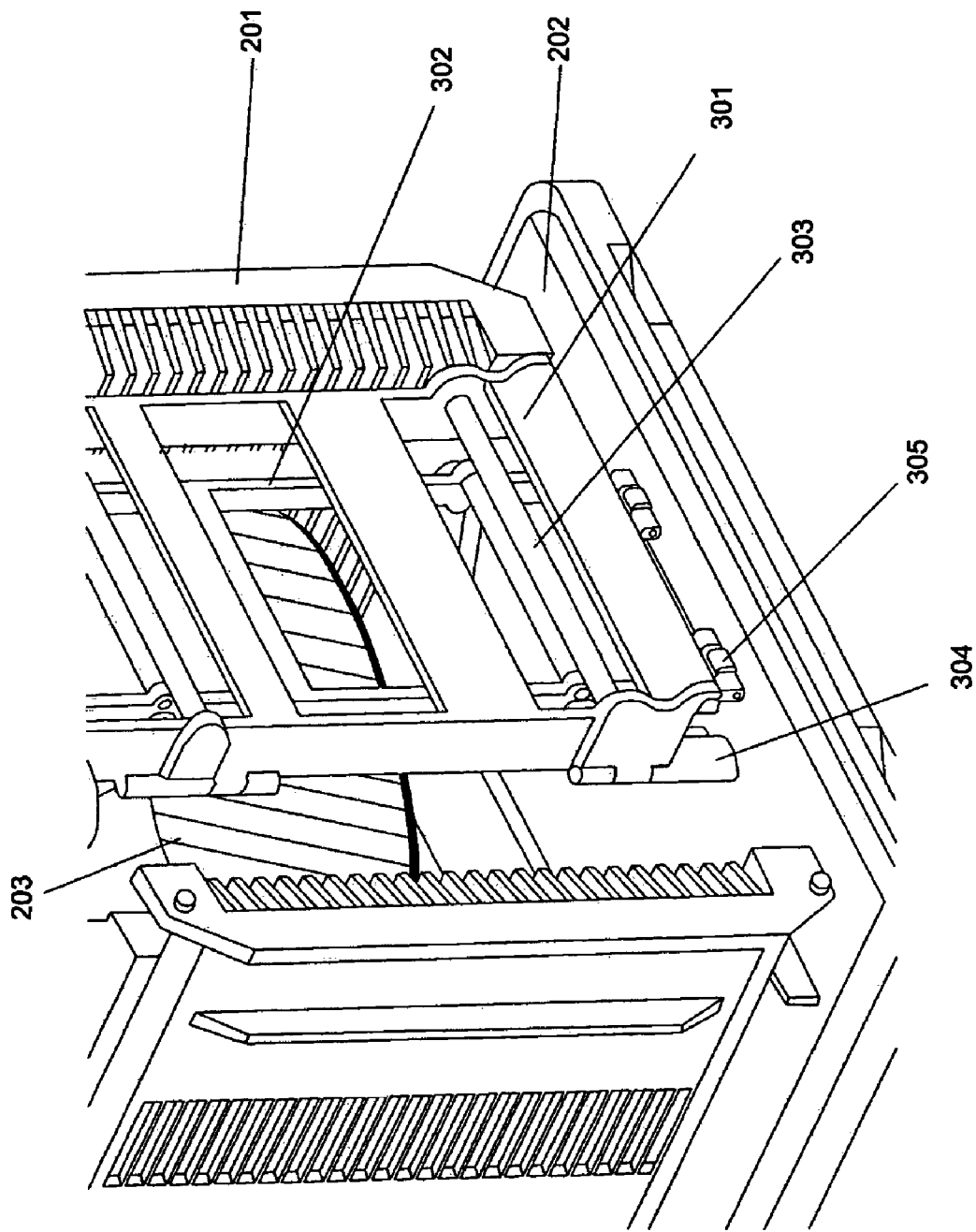
FIG. 2B is a perspective diagram showing the relationship between the base and the wafer holding device according to one embodiment of the invention.

Referring to FIGS. 2A and 2B, a wafer holding device 30 of this invention is equipped on the housing 100 of a wafer pod and the housing 100 and a base 202 with a wafer cassette 201 mounted thereon for storing a plurality of wafers 203 are assembled to form an airtight room for receiving and covering the wafer cassette 201. The wafer holding device 30 of this invention includes a support frame 301, an actuating frame 302, two rotating arms 303, and two wafer retainers 304. The support frame 301 is mounted on the housing, and the actuating frame 302 and the support frame 301 are connected via two rotating arms 303.

Figure 2C:
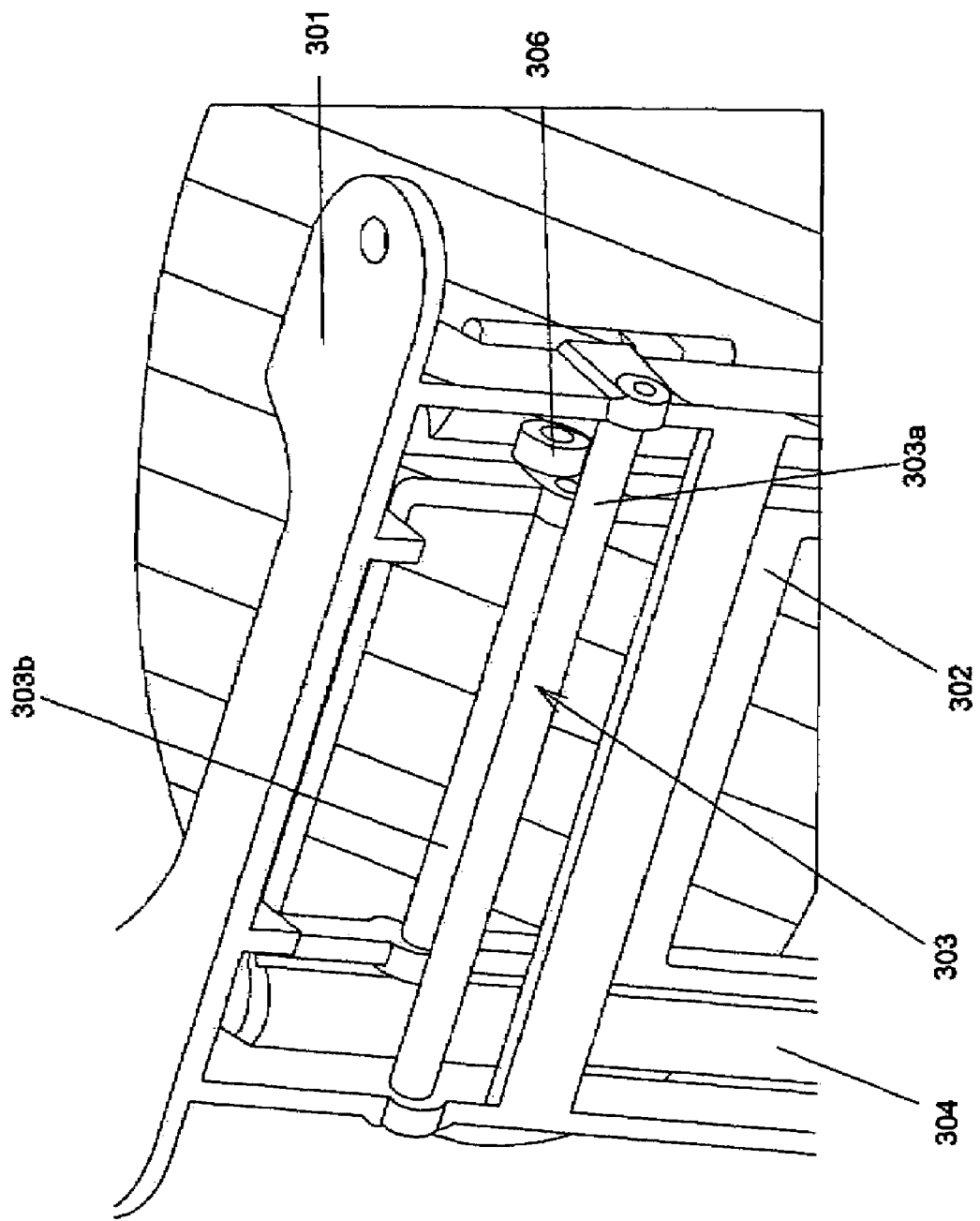
FIG. 2C is a perspective diagram showing the top portion of the wafer holding device according to one embodiment of the invention.

Referring to FIGS. 2A and 2C, two rotating arms 303 are provided apart. Each of the rotating arms 303 has a first rod 303a transversely connected to and pivoted on the support frame 301 and a second rod 303b transversely connected to and pivoted on the rectangular actuating frame 302. In this way, the support frame 301, the actuating frame 302 and two rotating arms 303 construct a four-bar linkage mechanism. In this embodiment, the rotating arms 303 are made of polyether ether ketone for avoiding any particulate release when the rotating arms 303 rub against the actuating frame 302 and the support frame 301.

Figure 2D:
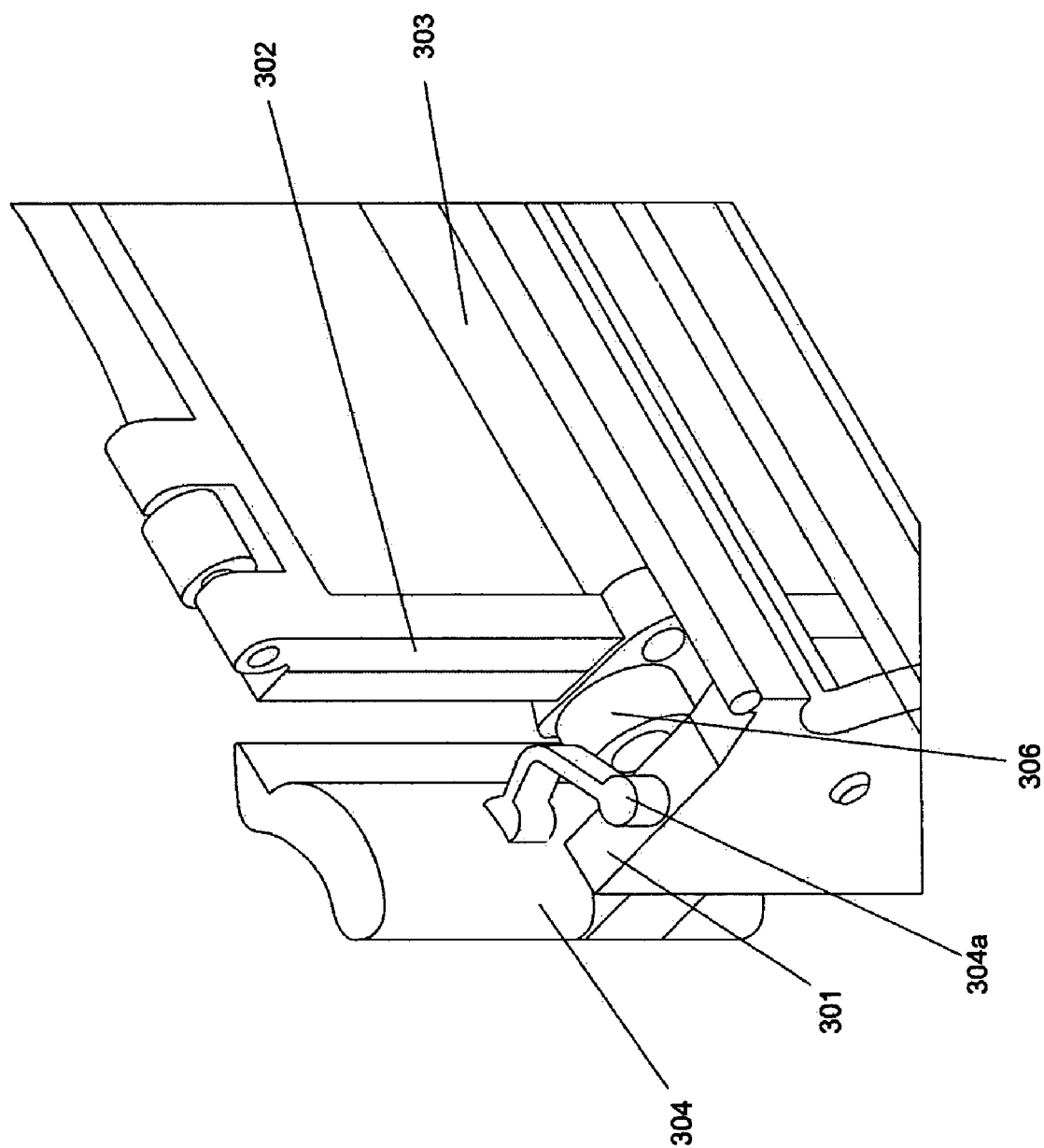
FIG. 2D is a perspective diagram showing the lower portion of the wafer holding device according to one embodiment of the invention.

Additionally, referring to FIGS. 2A, 2B and 2D, two wafer retainers 304 are respectively longitudinally connected to and pivoted on two sides of the support frame 301 and in contact with the actuating frame 302 such that the movement of the actuating frame 302 enables the wafer retainers 304 to rotate in a direction perpendicular to the edge surface of the wafers 203. After that, the rotating wafer retainers 304 apply forces in that direction to the edge surface of the wafers 203 and therefore securely retain the wafers 203.

Referring to FIGS. 2B and 2D, in this embodiment, the actuating frame 302 has two first rollers 305 respectively provided on two sides at the bottom of the actuating frame 302. The first rollers 305 contact with the base 202 and the base 202 force the actuating frame 302 to move upward when the housing 100 and the base 202 are assembled. These first rollers 305 are made of polyether ether ketone for avoiding any particulate release when they rub against the base 202.

Referring to FIGS. 2C and 2D, in this embodiment, the actuating frame 302 is further provided with four second rollers 306 respectively near four ends of the second rods 303b of the rotating arms 303. The second rollers 206 contact with the wafer retainers 304 such that the movement of the actuating frame 302 enables the second rollers 306 to force the wafer retainers 304 to rotate about their pivot when the housing and the base are assembled. Similarly, these rollers 306 and the wafer retainers 304 are made of polyether ether ketone for avoiding any particulate release when the rollers 306 rub against the wafer retainers 304.

On the other hand, as shown in FIG. 2D, each of the wafer retainers 304 is elastically pivoted on side of the support frame 301. In this embodiment, elastic plastic member 304a formed on the back of the wafer retainers 304 is used to construct the pivoting between the wafer retainers 304 and the support frame 301. Therefore, the actuating frame 302 returns to its original position due to gravity and the wafer retainers 304 returns to their original position due to the elasticity of the elastic plastic member 304a when the housing 100 and the base 202 are released from assembling.

Apparently, the wafer holding device of this invention not only provides well storage for wafers in a wafer pod but also overcomes the problems as mentioned in the prior art. The wafer holding device has the following benefits. First, providing retaining forces in direction perpendicular to the edge surface or parallel to the plane surface of the stored wafers so that the retaining forces are evenly distributed on the wafers and the wafer damages and undesired particulate release are prevented. Secondly, the rollers of the wafer holding device and the wafer retainers are made of high wear-resisting materials to further avoid any undesired particulate release.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A wafer holding device for retaining wafers stored in a wafer pod comprising a base with a wafer cassette mounted thereon and a housing for covering the base, the wafer holding device comprising:

a support frame for mounting on the housing;

an actuating frame;

a rotating arm having a first rod transversely connected to and pivoted on the support frame and a second rod transversely connected to and pivoted on the actuating frame; and two wafer retainers respectively longitudinally connected to and pivoted on two sides of the support frame and in contact with the actuating frame;

wherein the movement of the actuating frame enables the wafer retainers to rotate in a direction perpendicular to the edge surfaces of the wafers.

2. The wafer holding device as recited in claim 1, wherein the actuating frame is provided with two first rollers that contact with the base when the housing and the base are assembled.

3. The wafer holding device as recited in claim 2, wherein the first rollers are made of polyether ether ketone.

4. The wafer holding device as recited in claim 1, wherein the actuating frame is further provided with two second rollers near two ends of the second rod respectively, the second rollers contacting with the wafer retainers and forcing the wafer retainers to rotate when the housing and the base are assembled.

5. The wafer holding device as recited in claim 4, wherein the second rollers are made of polyether ether ketone.

6. The wafer holding device as recited in claim 1, wherein the wafer retainers are made of polyether ether ketone.

7. The wafer holding device as recited in claim 1, wherein the actuating frame is formed to be rectangular.

8. The wafer holding device as recited in claim 1, wherein the wafer retainers are respectively elastically pivoted on two sides of the support frame.

9. The wafer holding device as recited in claim 8, wherein each of the wafer retainers is pivoted on the support frame via an elastic plastic member formed thereon.

10. The wafer holding device as recited in claim 1, wherein the rotating arms are made of polyether ether ketone.

11. A wafer pod having a housing and a base with a wafer cassette for storing a plurality of wafers, the wafer cassette being covered by the housing when assembling the housing and the base, the wafer pod being characterized by having a wafer holding device comprising:

a support frame mounted on the housing;

an actuating frame;

two rotating arms each having a first rod transversely connected to and pivoted on the support frame and a second rod transversely connected to and pivoted on the actuating frame; and two wafer retainers longitudinally connected to and pivoted on two sides of the support frame respectively and in contact with the actuating frame;

wherein the movement of the actuating frame enables the wafer retainers to rotate in a direction perpendicular to the edge surfaces of the wafers.

12. The wafer pod as recited in claim 11, wherein the actuating frame has two first rollers that contact with the base when the housing and the base are assembled.

13. The wafer pod as recited in claim 12, wherein the first rollers are made of polyether ether ketone.

14. The wafer pod as recited in claim 11, wherein the actuating frame is further provided with two second rollers near two ends of the second rod respectively, the second rollers contacting with the wafer retainers and forcing the wafer retainers to rotate when the housing and the base are assembled.

15. The wafer pod as recited in claim 14, wherein the second rollers are made of polyether ether ketone.

16. The wafer pod as recited in claim 11, wherein the wafer retainers are made of polyether ether ketone.

17. The wafer pod as recited in claim 11, wherein the actuating frame is formed to be rectangular.

18. The wafer pod as recited in claim 11, wherein the wafer retainers are elastically pivoted on two sides of the support frame.

19. The wafer pod as recited in claim 18, wherein each of the wafer retainers is pivoted on the support frame via an elastic plastic member formed thereon.

20. The wafer pod as recited in claim 11, wherein the rotating arms are made of polyether ether ketone.

* * * * *